(12) United States Patent
Moriya et al.

(10) Patent No.: US 7,851,379 B2
(45) Date of Patent: Dec. 14, 2010

(54) SUBSTRATE PROCESSING METHOD AND SUBSTRATE PROCESSING APPARATUS

(75) Inventors: Atsushi Moriya, Toyama (JP); Yasuhiro Inokuchi, Toyama (JP); Yasuo Kunii, Takasaki (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 90 days.

(21) Appl. No.: 12/410,963

(22) Filed: Mar. 25, 2009

(65) Prior Publication Data

US 2009/0325366 A1 Dec. 31, 2009

(30) Foreign Application Priority Data

Jun. 30, 2008 (JP) .............................. 2008-169819

(51) Int. Cl.
*H01L 21/31* (2006.01)
*H01L 21/469* (2006.01)
(52) U.S. Cl. .............................. 438/761; 257/E21.103; 257/E21.104; 118/725
(58) Field of Classification Search ........................ None
See application file for complete search history.

(56) References Cited

U.S. PATENT DOCUMENTS

| | | | | |
|---|---|---|---|---|
| 5,656,531 A | * | 8/1997 | Thakur et al. | 438/398 |
| 5,837,580 A | * | 11/1998 | Thakur et al. | 438/255 |
| 5,959,326 A | * | 9/1999 | Aiso et al. | 257/306 |
| 6,121,081 A | * | 9/2000 | Thakur et al. | 438/238 |
| 6,281,057 B2 | * | 8/2001 | Aya et al. | 438/166 |

\* cited by examiner

*Primary Examiner*—Jarrett J Stark
(74) *Attorney, Agent, or Firm*—Brundidge & Stanger, P.C.

(57) ABSTRACT

There are provided a substrate processing method and apparatus adapted to prevent deterioration of film thickness uniformity while maintaining the film forming rate. The substrate processing method comprises: (a) accommodating a plurality of substrates in a process chamber by carrying and stacking the substrates in the process chamber, (b) forming first amorphous silicon films to a predetermined thickness by heating at least the substrates and supplying first gas, and (c) forming second amorphous silicon films to a predetermined thickness by heating at least the substrates and supplying second gas different from the first gas. The first gas is higher order gas than the second gas.

8 Claims, 3 Drawing Sheets

US 7,851,379 B2

SUBSTRATE PROCESSING METHOD AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-169819, filed on Jun. 30, 2008, in the Japanese Patent Office, the entire contents of which are hereby incorporated by reference.

BACKGROUND OF THE INVENTION

1. Field of the Invention

The present invention relates to a substrate processing method and apparatus for forming an amorphous silicon film on a monocrystalline substrate having an insulating film formed on at least a surface portion thereof and an exposed silicon surface.

2. Description of the Prior Art

There are conventional substrate processing methods and apparatuses for forming an amorphous silicon film on a monocrystalline substrate having an insulating film formed on at least a surface portion thereof and an exposed silicon surface.

However, such conventional substrate processing methods and apparatuses have limitations, such as a low film forming rate when a silicon film is formed at a low temperature and non-uniformity in film thickness when a silicon film is formed using highly reactive gas.

That is, in the related art, if a substrate is processed by, for example, a lateral solid phase epitaxial growth method, fine crystalline grains are easily formed between amorphous silicon (a-Si) and an insulating film, and in this case, when heat treatment is performed for monocrystallization of Si, the fine crystalline grains grow and make the monocrystallization of Si difficult.

To suppress growth of such fine crystalline grains, a-Si can be grown at a low temperature. For example, in the case of a chemical vapor deposition (CVD) method using $SiH_4$, a-Si may be reliably grown at a temperature of 580° C. or lower because 600° C. is a boundary temperature between a-Si growth and polysilicon (poly-Si) growth. Therefore, in the CVD method using $SiH_4$, the film forming temperature may be kept equal to or lower than 580° C.

However, in the case of such a low-temperature process, the film forming rate is low. For example, if the film forming process is performed at 80 Pa and 580° C., a-Si grows at a rate of about 6 nm/min; however, if the process temperature reduces to 530° C., the growing rate of a-Si reduces to about 2 nm/min.

To increase the growing rate reduced due to a low process temperature, highly reactive gas such as $Si_2H_6$ can be used. If $Si_2H_6$ is used as process gas, the growing rate can be maintained at about 3 nm/min even when the pressure and temperature of a film forming process are low at about 25 Pa and 500° C.

However, in the case where highly reactive gas is used as process gas, the thickness uniformity of a film is deteriorated. For example, if a film is formed on a φ200-mm substrate (wafer) at 530° C. by using $SiH_4$ as process gas, the in-plane thickness uniformity of the film can be within ±1%. However, if a film is formed on a φ200-mm substrate at 500° C. by using highly reactive $Si_2H_6$ as process gas, the in-plane thickness uniformity of the film is deteriorated to a level greater than ±5%.

As explained above, according to the conventional substrate processing methods and apparatuses, a substrate cannot be processed with good in-plane film thickness uniformity while maintaining the film forming rate at a desired level.

SUMMARY OF THE INVENTION

An object of the present invention is to provide a substrate processing method and apparatus adapted to prevent deterioration of film thickness uniformity while maintaining the film forming rate. Specifically, an object of the present invention is to provide a substrate processing method and apparatus adapted to prevent generation of fine crystalline grains at a place such as the interface between amorphous-silicon (a-Si) and an insulating film for ensuring film thickness uniformity while maintaining the film forming rate.

According to an aspect of the present invention, there is provided a substrate processing method for forming an amorphous silicon film on a monocrystalline substrate having an insulating film formed on at least a surface portion thereof and an exposed silicon surface, the substrate processing method comprising: (a) accommodating a plurality of substrates in a process chamber by carrying and stacking the substrates in the process chamber; (b) forming first amorphous silicon films to a predetermined thickness by heating at least the substrates and supplying first gas; and (c) forming second amorphous silicon films to a predetermined thickness by heating at least the substrates and supplying second gas different from the first gas, wherein the first gas is higher order gas than the second gas.

According to another aspect of the present invention, there is provided a substrate processing apparatus comprising: a process chamber configured to process a plurality of substrates accommodated in the process chamber in a stacked manner; a heating unit configured to heat the substrates accommodated in the process chamber; a gas supply unit configured to supply predetermined gas to an inside of the process chamber; an exhaust unit configured to exhaust gas from the inside of the process chamber; and a control unit configured to control at least the gas supply unit, wherein the control unit controls the gas supply unit to form first amorphous silicon films on the substrates by supplying first gas to the inside of the process chamber, and then to form second amorphous silicon films on the substrates by supplying second gas having a lower order than the first gas to the inside of the process chamber.

DETAILED DESCRIPTION OF THE PREFERRED EMBODIMENTS

A substrate processing method and apparatus relevant to embodiments of the pressure will be described hereinafter with reference to the attached drawings.

Figure 1:
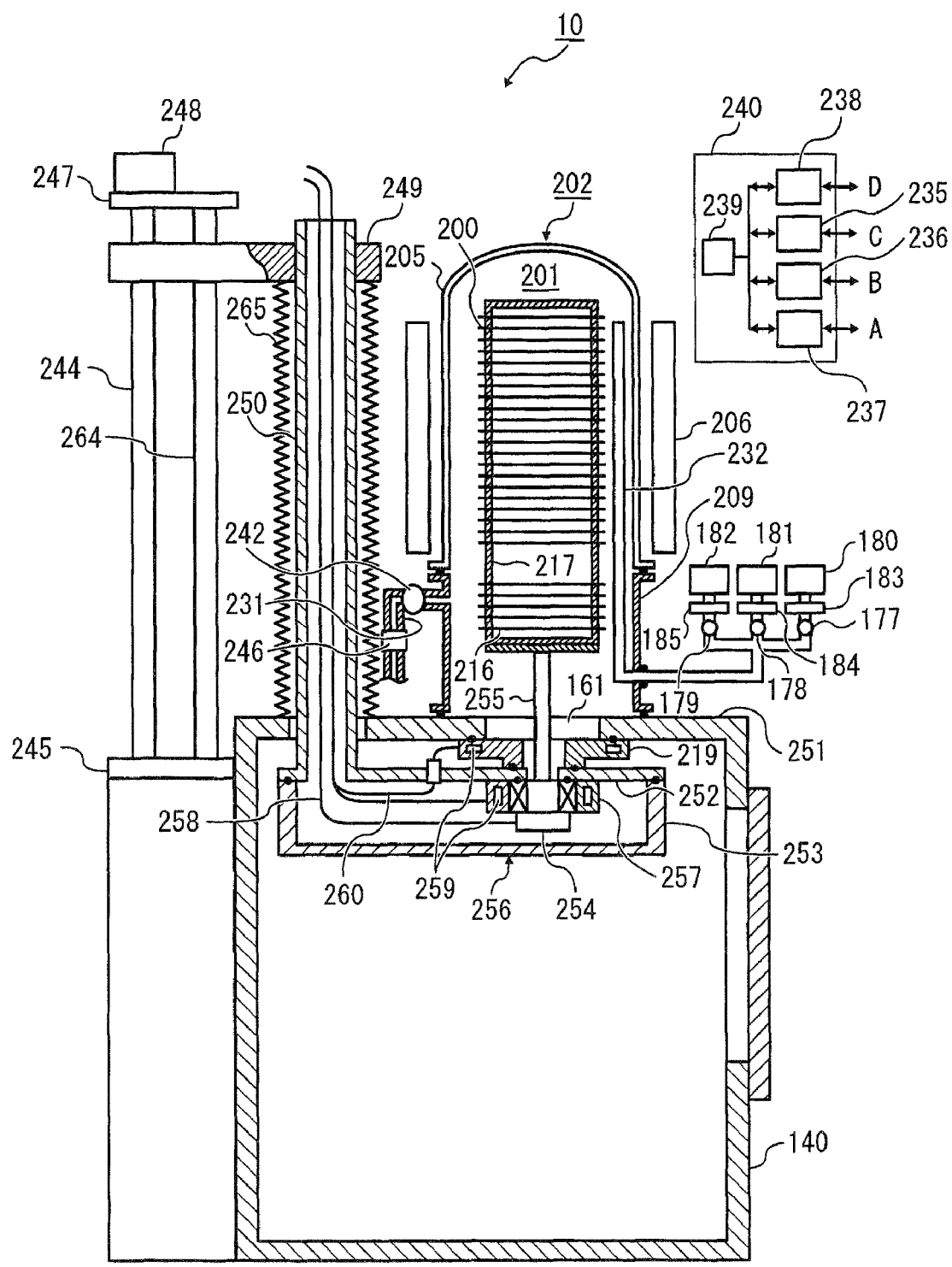
FIG. 1 is a cross-sectional view illustrating a substrate processing apparatus relevant to an embodiment of the present invention.

FIG. 1 illustrates a substrate processing apparatus 10 relevant to an embodiment of the present invention.

The substrate processing apparatus 10 is configured as a vertical chemical vapor deposition (CVD) apparatus for performing a substrate processing process relevant to an embodiment of the present invention.

Although the substrate processing apparatus 10 is a vertical CVD apparatus, the present invention can be applied to other substrate processing apparatuses such as a horizontal CVD apparatus and a single wafer type CVD apparatus. In addition, although the substrate processing apparatus 10 is a so-called hot-wall type apparatus, the present invention can be applied to a so-called cold-wall type apparatus.

As shown in FIG. 1, the substrate processing apparatus 10 includes a process furnace 202 and a heater 206 as a heating unit.

The heater 206 has a cylindrical shape and is configured by a heating element and an insulating member installed around the heating element. The heater 206 is vertically installed on a holder (not shown).

Inside the heater 206, an outer tube 205 used as a reaction tube is installed coaxially with the heater 206. The outer tube 205 is made of a heat resistant material such as quartz ($SiO_2$) or silicon carbide (SiC), and the outer tube 205 has a cylindrical shape with a closed top side and an opened bottom side. In the hollow cylindrical area of the outer tube 205, a process chamber 201 is formed to accommodate a boat 217 in which Si substrates 200 are horizontally oriented and vertically arranged in multiple stages.

At the bottom side of the outer tube 205, a manifold 209 is installed coaxially with the outer tube 205. For example, the manifold 209 may be made of stainless steel and have a cylindrical shape with opened top and bottom sides. The manifold 209 is installed to support the outer tube 205. An O-ring is disposed between the outer tube 205 and the manifold 209 as a seal. The manifold 209 is supported by a holder (not shown) so that the outer tube 205 can be kept in an upright position. A reaction chamber is formed by the outer tube 205 and the manifold 209.

A gas exhaust pipe 231 is installed at the manifold 209, and a gas supply pipe 232 is installed through the manifold 209 as well. The upstream side of the gas supply pipe 232 is divided into three branches, and the three branches are respectively connected to first to third gas supply sources 180, 181, and 182 through valves 177, 178, and 179, and mass flow controllers (MFCs) 183, 184, and 185 that are used as gas flow rate control devices. A gas flow control unit 235 is electrically connected to the MFCs 183, 184, and 185, and the valves 177, 178, and 179, so as to supply desired amounts of gas at a desired time.

A vacuum exhaust unit 246 such as a vacuum pump is connected to the downstream side of the gas exhaust pipe 231 through a pressure sensor (not shown) used as a pressure detector and an automatic pressure controller (APC) valve 242 used as a pressure regulator. The pressure sensor and the APC valve 242 are electrically connected to a pressure control unit 236 so that the pressure control unit 236 can control the APC valve 242 based on a pressure detected by the pressure sensor to adjust the inside pressure of the process chamber 201 to a desired level at a desired time.

A seal cap 219 is installed under the manifold 209 as a furnace cover for sealing the opened bottom side of the manifold 209. For example, the seal cap 219 may be made of a metal such as stainless steel and have a disk shape. An O-ring is disposed on the top of the seal cap 219 as a seal. The O-ring is in contact with the bottom side of the manifold 209. A rotary mechanism 254 is installed at the seal cap 219. A rotation shaft 255 of the rotary mechanism 254 is connected to the boat 217 through the seal cap 219 to rotate the Si substrates 200 by rotating the boat 217.

The seal cap 219 is configured to be moved vertically by a lift motor 248 (described later in detail) installed outside the process furnace 202 as a lift mechanism, so that the boat 217 can be loaded into and unloaded from the process chamber 201. A driving control unit 237 is electrically connected to the rotary mechanism 254 and the lift motor 248 to control a predetermined operation at a desired time.

The boat 217 used as a substrate holder is made of a heat resistant material such as quartz or silicon carbide and is configured to hold a plurality of horizontally oriented Si substrates 200 in multiple stages with centers of the Si substrates 200 being aligned with each other. At a lower part of the boat 217, a plurality of heat resistant members, such as circular heat resistant plates 216 made of a heat resistant material such as quartz or silicon carbide, are horizontally oriented in multiple stages in order to prevent heat transfer from the heater 206 to the manifold 209.

Near the heater 206, a temperature sensor (not shown) is installed as a temperature detector to measure the temperature inside the process chamber 201. The heater 206 and the temperature sensor are electrically connected to a temperature control unit 238 so that the inside temperature of the process chamber 201 can be maintained at a desired temperature distribution at a desired time by controlling the power condition of the heater 206 based on temperature information detected by the temperature sensor.

In this configuration of the process furnace 202, first process gas (first gas) is supplied from the first gas supply source 180, and the flow rate of the first process gas is controlled by the MFC 183. Then, the first process gas is introduced into the process chamber 201 by the gas supply pipe 232 through the valve 177. Second process gas (second gas) is supplied from the second gas supply source 181, and the flow rate of the second process gas is controlled by the MFC 184. Then, the second process gas is introduced into the process chamber 201 by the gas supply pipe 232 through the valve 178. Third process gas (third gas) is supplied from the third gas supply source 182, and the flow rate of the third process gas is controlled by the MFC 185. Then, the third process gas is introduced into the process chamber 201 by the gas supply pipe 232 through the valve 179. The process gas is discharged from the process chamber 201 by the vacuum pump 246 connected to the gas exhaust pipe 231 as an exhaust device.

An exemplary surrounding structure of the process furnace of the substrate processing apparatus will now be described.

A lower base 245 is installed on an outer side of a loadlock chamber 140 used as an auxiliary chamber. At the lower base 245, a guide shaft 264 inserted in a lift plate 249 and a ball screw 244 coupled to the lift plate 249 are installed. The guide shaft 264 and the ball screw 244 are erected on the lower base 245, and an upper base 247 is installed on the upper ends of the guide shaft 264 and the ball screw 244. The ball screw 244 is rotated by the lift motor 248 installed on the upper base 247. The lift plate 249 is configured to be moved upward or downward by rotation of the ball screw 244.

At the lift plate, a hollow lift shaft 250 is installed to be extended from the lift plate 249, and the interfacial area between the lift plate 249 and the lift shaft 250 is air-tightly sealed. The lift shaft 250 is configured to be moved upward and downward together with the lift plate 249. The lift shaft 250 is movably inserted through a top plate 251 of the loadlock chamber 140. A penetration hole of the top plate 251 through which the lift shaft 250 is inserted is large enough for preventing the lift shaft 250 from contacting the top plate 251.

Between the loadlock chamber and the lift plate 249, a flexible hollow structure such as a bellows 265 is installed to enclose the lift shaft 250 for sealing the loadlock chamber 140. The bellows 265 can be sufficiently expanded and contracted in accordance with a movement of the lift plate 249, and the bellows 265 has an inner diameter sufficiently greater than the outer diameter of the lift shaft 250 so as not to make contact with the lift shaft 250 during expansion or contraction.

A lift base 252 is horizontally fixed to a lower end of the lift shaft 250. A driver cover 253 is air-tightly coupled to the bottom of the lift base 252 with a seal such as an O-ring being interposed therebeween. The lift base 252 and the driver cover 253 form a driver case 256. Therefore, the inside of the driver case 256 is isolated from the inside atmosphere of the loadlock chamber 140.

The rotary mechanism 254 for the boat 217 is installed inside the driver case 256, and the surrounding of the rotary mechanism 254 is cooled by a cooling mechanism 257.

Power cables 258 are connected from an upper end of the hollow lift shaft 250 to the rotary mechanism 254 through the hollow lift shaft 250. Cooling passages 259 are formed in the cooling mechanism 257 and the seal cap 219, and a coolant tube 260 is connected from the upper end of the hollow lift shaft 250 to the cooling passages 259 through the hollow lift shaft 250 for supplying cooling water.

As the ball screw 244 rotates upon the operation of the lift motor 248, the driver case 256 is lifted together with the lift plate 249 and the lift shaft 250.

As the driver case 256 is lifted, a furnace throat (opening) 161 of the process furnace 202 is closed by the seal cap 219 air-tightly installed at the lift base 252, and in this state, wafer processing is possible. By lowering the driver case 256, both the seal cap 219 and the boat 217 can be moved down to carry the Si substrates 200 to the outside.

The gas flow control unit 235, the pressure control unit 236, the driving control unit 237, and the temperature control unit 238 constitute an operation control unit and an input/output unit, and they are electrically connected to a main control unit 239 which controls the overall operation of the substrate processing apparatus 10. The gas flow control unit 235, the pressure control unit 236, the driving control unit 237, the temperature control unit 238, and the main control unit 239 constitute a controller 240.

In the substrate processing apparatus 10, when a plurality of Si substrates 200 are charged to the boat 217, the lift motor 248 is operated to move up the lift plate 249 and the lift shaft 250 so as to load the boat 217 into the process chamber 201 as shown in FIG. 1. In this state, the bottom side of the manifold 209 is sealed by the seal cap 219 with an O-ring being interposed therebetween.

The inside of process chamber 201 is evacuated by the vacuum exhaust unit 246 to a desired pressure (vacuum degree). At this time, the pressure inside the process chamber 201 is measured with the pressure sensor, and the pressure regulator 242 is feedback controlled based on the measured pressure. The inside of the process chamber 201 is heated by the heater 206 to a desired temperature. At this time, power to the heater 206 is feedback controlled based on temperature information detected by a temperature sensor so as to obtain desired temperature distribution in the process chamber 201. Thereafter, the rotary mechanism 254 rotates the boat 217 in which the Si substrates 200 are charged.

As process gases, $Si_2H_6$, $SiH_4$, and $H_2$ are respectively filled in the first gas supply source 180, the second gas supply source 181, and the third gas supply source 182 for being supplied to the inside of the process chamber 201. To control desired gas flow, openings of the MFCs 183, 184, and 185 are adjusted, and then the valves 177, 178, and 179 are opened to introduce the process gases into the process chamber 201 from the upper part of the process chamber 201 through the gas supply pipe 232. The introduced gases are discharged from the process chamber 201 through the gas exhaust pipe 231. While the process gases pass through the process chamber 201, the process gases make contact with the Si substrates 200 so that Si films can be deposited on the surfaces of the Si substrates 200.

After a predetermined time passed, inert gas is supplied from an inert gas supply source (not shown) to purge the inside of the process chamber 201 and replace the inside atmosphere of the process chamber 201 with the inert gas, and at the same time, the pressure inside the process chamber 201 returns to atmospheric pressure.

Thereafter, the lift motor 248 is operated to move down the seal cap 219 and open the bottom side of the manifold 209, and the processed Si substrates 200 charged in the boat 217 are unloaded from the bottom side of the manifold 209 to the outside of the outer tube 205. Then, the processed Si substrates 200 are discharged from the boat 217.

For example, the above-described substrate processing apparatus 10 may be used for manufacturing large scale integration (LSI) devices using a silicon on insulator (SOI) structure.

According to LSI manufacturing using an SOI structure, device operation speed can be increased owing to reduced parasitic capacitance, and devices can be easily isolated. Therefore, advantages such as easy integration of LSI devices can be achieved. Surface monocrystal separation methods such as separation by implanted oxygen (SIMOX) are used as methods of forming an SOI structure. SIMOX is a method of forming an inner insulating film while preserving a surface monocrystalline Si layer.

In addition, as another method of forming an SOI structure, there is a lateral solid phase epitaxial growth method. In the lateral solid phase epitaxial growth method, a lateral epitaxial growth method is used to grow a monocrystalline Si layer on an insulating film formed on the surface of a Si substrate partially or entirely. The substrate processing apparatus 10 processes substrates using a lateral epitaxial growth method. Hereinafter, more detailed descriptions will be given.

Figure 2A:
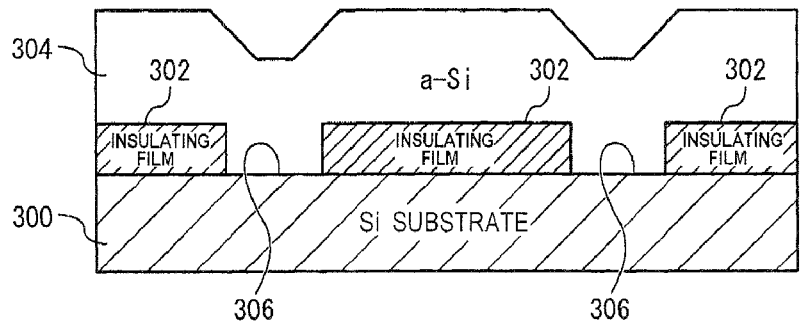
FIG. 2A to FIG. 2C are views for explaining a substrate processing process performed using a substrate processing apparatus relevant to an embodiment of the present invention.
Figure 2B:
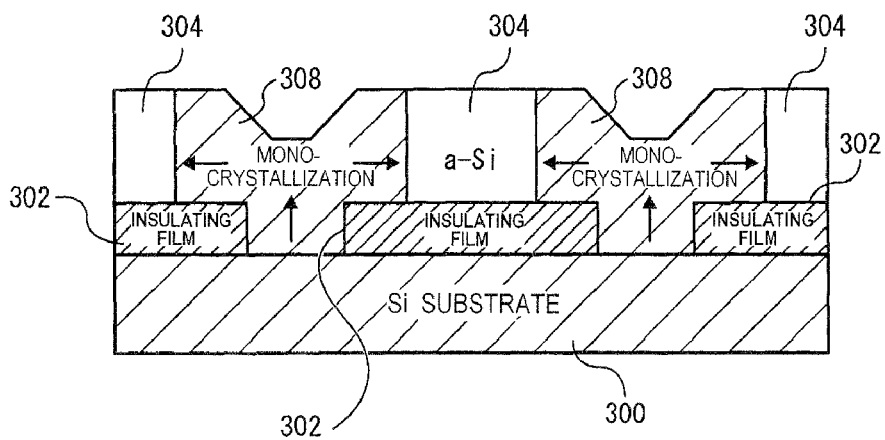
Figure 2C:
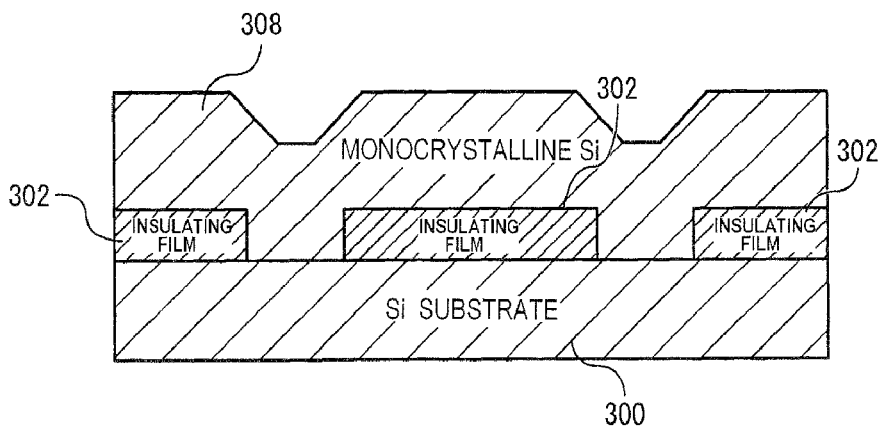

FIG. 2A to FIG. 2C are views for explaining a substrate processing process performed using the substrate processing apparatus 10. Specifically, FIG. 2A to FIG. 2C are views for explaining a substrate processing process performed by a lateral solid phase epitaxial growth method using the substrate processing apparatus 10.

First, referring to FIG. 2A, an amorphous silicon (a-Si) film 304 is formed on a Si substrate 300 where an insulating film 302 is partially formed.

Next, the Si substrate 300 is heat-treated. In detail, the Si substrate 300 is heated to about 500° C. to about 700° C. By heat-treating the Si substrate 300, as shown in FIG. 2B, openings 306 formed on the Si substrate 300 act as crystallization seeds so that the a-Si film 304 formed on the insulating film 302 can be transformed into a monocrystal to form a monocrystalline layer 308. By continuing the heat treatment for a predetermined time, the a-Si film 304 formed on the insulating film 302 can be wholly crystallized into a monocrystal as shown in FIG. 2C.

Through the above-described operations, the monocrystalline layer 308 is formed on the insulating film 302. Consequently, by forming the monocrystalline layer 308 and repeating the above-described operations on the monocrystalline layer 308, circuits can be formed in a three-dimensionally integrated structure, and thus the degree of freedom in semiconductor device structure design can be improved.

For example, by repeating the above-described lateral solid phase epitaxial growth method, semiconductor devices such as three-dimensional LSI devices can be manufactured.

Figure 3A:
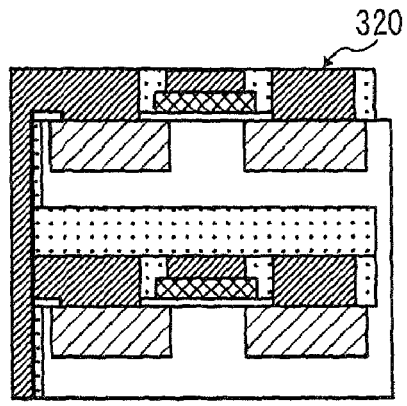
FIG. 3A to FIG. 3C are views for explaining a three-dimensional large scale integration (LSI) process preformed using a lateral solid phase epitaxial growth method and a substrate processing apparatus relevant to an embodiment of the present invention.
Figure 3B:
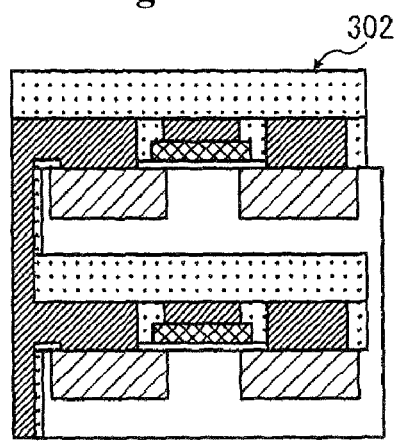
Figure 3C:
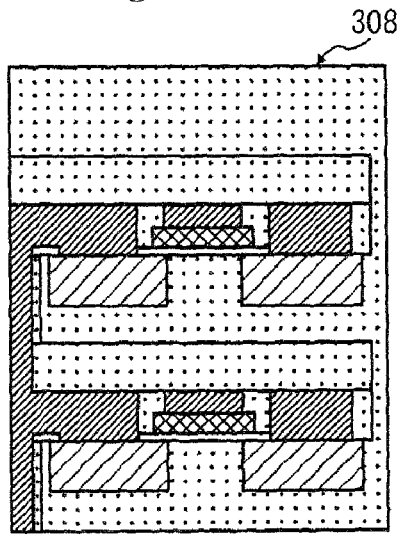

FIG. 3A to FIG. 3C are views for explaining a three-dimensional LSI process as a manufacturing process preformed using a lateral solid phase epitaxial growth method.

First, a circuit 320 formed on a substrate as shown in FIG. 3A is covered with an insulating film 302 as shown in FIG. 3B. Thereafter, according to the method explained with reference to FIG. 2A to 2C, an s-Si film is formed on the insulating film 302, and the a-Si film is heat treated to transform the a-Si film into a monocrystal and thus to form a monocrystalline layer 308.

By repeating the above-described operations, three-dimensional LSI devices having a multi-layer structure can be manufactured.

In the above-described lateral solid phase epitaxial growth method, when the a-Si film 304 is formed, it is important to maintain the interface between the a-Si film 304 and the Si substrate 300 at a highly cleaned state. As explained above, the a-Si formed on the insulating film 302 is transformed into a monocrystal by using the openings 306 formed on the Si substrate 300 as crystallization seeds. Therefore, if cleaning is insufficient, or an oxide film is naturally formed on the Si substrate 300, or contaminants are attached to the Si substrate 300, the Si substrate 300 does not act as seeds, and thus monocrystallization of the a-Si does not proceed properly.

However, since the substrate processing apparatus 10 relevant to an embodiment of the present invention is a CVD apparatus that can provide a highly cleaned state for epitaxial growth, the interface between the a-Si film 304 and the Si substrate 300 can be kept at a highly cleaned state, and thus proper monocrystallization is possible.

In addition, in the lateral solid phase epitaxial growth method, it is important to suppress generation of fine crystalline grains at the interface between the a-Si film 304 and the insulating film 302. If fine crystalline grains are generated, monocrystallization is disturbed because the fine crystalline grains grow when the a-Si film 304 is heat-treated for monocrystallization.

Therefore, in the current embodiment, generation of fine crystalline grains at the interface between the a-Si film 304 and the insulating film 302 is suppressed by using a uniquely researched method. Furthermore, unique research has been conducted to suppress generation of fine crystalline grains at the interface between the a-Si film 304 and the insulating film 302 while maintaining film forming speed and film thickness uniformity.

Hereinafter, detailed descriptions thereof will be given.

In the following description, a Si substrate 300 is processed in the substrate processing apparatus 10 in a state where the controller 240 controls a gas supply unit constituted by at least the MFCs 183, 184, and 185, and the valves 177, 178, and 179.

In the present invention, when an a-Si film 304 is formed, $Si_2H_6$ is used as first gas to form the a-Si film 304 to a small thickness at a low process temperature where polycrystallization is difficult, so as to suppress generation of fine crystallize grains between the a-Si film 304 and an insulating film 302. Thereafter, the process temperature is increased, and $SiH_4$ is used as second gas, so as to superimpose another thickness on the small thickness of the a-Si film 304 formed at a low process temperature by using $Si_2H_6$, thereby making the a-Si film 304 thick. Therefore, the a-Si film 304 can be uniformly formed without reducing the growing rate of the a-Si film 304. Here, $Si_2H_6$ used as the first gas (first process gas) is a high-order silane compound as compared with $SiH_4$ used as the second gas (second process gas). Generally, the temperature of a film forming process can be reduced by using higher order process gas.

For example, when an a-Si film 304 may be formed to a thickness of 500 nm, the first 50 nm of the a-Si film 304 may be formed using $Si_2H_6$ as process gas at a process temperature of 500° C. while maintaining the inside pressure of the process chamber 201 at 25 Pa. In this case, since the process temperature of 500° C. is relatively low, generation of fine crystalline grains can be suppressed at the interface between the a-Si film 304 and an insulating film 302.

Instead of forming the first 50 nm of the a-Si film 304 by using $Si_2H_6$ as process gas, only the first layer of the a-Si film 304 may be formed by using $Si_2H_6$ as process gas. In addition, the thickness of the a-Si film 304 formed through the first process performed using $Si_2H_6$ as process gas is not limited to 50 nm.

The process temperature of 500° C. is an exemplary temperature that is equal to or higher than the decomposition temperature of $Si_2H_6$ (process gas). However, the process temperature is not limited to 500° C. The process temperature may range from 450° C. to 500° C.

Thereafter, the remaining thickness of 450 nm is formed using $SiH_4$ as process gas after increasing the process temperature to about 580° C. and the inside pressure of the process chamber 201 equal to or higher than 80 Pa. In this way, since $SiH_4$ is used to superimpose the remaining thickness of the a-Si film 304 on the first thickness of the a-Si film 304 formed using $Si_2H_6$, the thickness uniformity of the a-Si film 304 can be improved as compared with the case where the whole thickness (500 nm) of the a-Si film 304 is formed using only $Si_2H_6$.

In the above-described process, the process temperature of 580° C. is lower than the polycrystallization temperature limit (600° C.) of the process gas ($SiH_4$). In the case where a process is performed using $SiH_4$, the rate of polycrystallization reduces if the process temperature is reduced from 580° C. to 545° C.

In the above-described processes, the first film forming process using $Si_2H_6$ requires about 17 minutes, and the next film forming process using $SiH_4$ requires about 75 minutes; that is, although times necessary for increasing and stabilizing the process temperature are added, all the film forming processes can be finished within 120 minutes.

In addition, when in-plane film thickness uniformity is considered, since the thickness of 450 nm formed using $SiH_4$ is the dominant thickness, film thickness uniformity can be improved as compared with the case of using only $Si_2H_6$, and the in-plane film thickness uniformity can be kept within ±2%.

The film growing rate is 3 nm/minute in the first film forming process using $Si_2H_6$ and 6 nm/minute in the next film forming process using $SiH_4$.

In a process of forming an a-Si film 304 to a thickness of 500 nm by using the substrate processing apparatus 10, if the whole 500-nm thickness of the a-Si film 304 is formed using only $SiH_4$, the process time increases to about 250 minutes although the process temperature is set to 530° C. On the other hand, if the whole 500-nm thickness is formed at a process temperature of 500° C. by using only $Si_2H_6$, the process time reduces to about 167 minutes; however, in-plane film thickness uniformity becomes greater than ±5%.

In the above description, the case of using $Si_2H_6$ and $SiH_4$ is explained; however, other gases can be used as first and second gases, as long as the first gas is high-order gas and the second gas is relatively low-order gas. For example, high order silane gas such as $Si_3H_8$ or $Si_4H_{10}$ can be used as the first gas, and halogen containing silane gas such as $SiH_2Cl_2$ or $SiH_3Cl$ can be used as the second gas.

Furthermore, in the above description, the process temperature is increased from 500° C. to 580° C.; however, the process temperature is not limited thereto. Furthermore, in the above-described example, the a-Si film 304 is formed in a two-layer structure using two different film forming conditions; however, the a-Si film 304 can be formed using three or more different film forming conditions.

According to the present invention, there are provided a substrate processing method and apparatus adapted to prevent deterioration of film thickness uniformity while maintaining the film forming rate. Specifically, according to the present invention, there are provided a substrate processing method and apparatus adapted to prevent generation of fine crystalline grains at a place such as the interface between a-Si and an insulating film for ensuring film thickness uniformity while maintaining the film forming rate.

As described above, the present invention can be applied a substrate processing apparatus for treating a substrate such as a wafer, and a semiconductor device manufacturing method.

Although the present invention is characterized by the appended claims, the present invention also includes the following embodiments.

(Supplementary Note 1)

According to an embodiment of the present invention, there is provided a substrate processing method for forming an amorphous silicon film on a monocrystalline substrate having an insulating film formed on at least a surface portion thereof and an exposed silicon surface, the substrate processing method comprising: (a) accommodating a plurality of substrates in a process chamber by carrying and stacking the substrates in the process chamber; (b) forming first amorphous silicon films to a predetermined thickness by heating at least the substrates and supplying first gas; and (c) forming second amorphous silicon films to a predetermined thickness by heating at least the substrates and supplying second gas different from the first gas, wherein the first gas is higher order gas than the second gas.

(Supplementary Note 2)

The substrate processing method of Supplementary Note 1 may further comprise (d) performing heat treatment on the first and second amorphous silicon films for allowing solid phase epitaxial growth in a state where exposed monocrystalline silicon surfaces of the substrates act as seeds.

(Supplementary Note 3)

In the substrate processing method of Supplementary Note 1 or 2, the forming (c) may be performed at a higher process temperature than the forming (b).

(Supplementary Note 4)

In the substrate processing method of any one of Supplementary Notes 1 to 3, the forming (c) may be performed by heating the substrates to a temperature lower than a polycrystallization temperature of the second gas.

(Supplementary Note 5)

In the substrate processing method of any one of Supplementary Notes 1 to 4, the forming (b) may be performed by heating the substrates to a temperature ranging from about 450° C. to about 550° C., and the forming (c) is performed by heating the substrates to a temperature equal to or lower than about 580° C.

(Supplementary Note 6)

In the substrate processing method of any one of Supplementary Notes 1 to 4, the forming (b) may be performed by heating the substrates to a temperature ranging from about 450° C. to about 550° C. and using $Si_2H_6$ as the first gas, and the forming (c) may be performed by heating the substrates to a temperature higher than the temperature to which the substrates are heated in the forming (b) but equal to or lower than about 580° C. and by using $SiH_4$ as the second gas.

(Supplementary Note 7)

According to another embodiment of the present invention, a substrate processing method comprises: (a) accommodating a plurality of substrates in a process chamber by carrying and stacking the substrates in the process chamber; (b) forming first amorphous silicon films to a predetermined thickness by heating the substrates to a temperature ranging from about 450° C. to about 550° C. and supplying $Si_2H_6$ gas to the process chamber; (c) forming second amorphous silicon films to a predetermined thickness by heating the substrates to a temperature higher than the temperature to which the substrates are heated in the forming (b) but equal to or lower than about 580° C. and by supplying $SiH_4$ gas to the process chamber; and (d) performing heat treatment on the first and second amorphous silicon films for allowing solid phase epitaxial growth in a state where exposed monocrystalline silicon surfaces of the substrates act as seeds.

(Supplementary Note 8)

The substrate processing method of any one of Supplementary Notes 1 to 7 may further comprise purging an inside of the process chamber after the forming (b) but prior to the forming (c).

(Supplementary Note 9)

In the substrate processing method of any one of Supplementary Notes 1 to 8, the accommodating (a) may be performed at a pressure lower than a pressure at which the forming (b) is performed.

(Supplementary Note 10)

In the substrate processing method of any one of Supplementary Notes 1 to 9, the first amorphous silicon films formed in the forming (b) may have a single layer structure.

(Supplementary Note 11)

According to another embodiment of the present invention, a substrate processing apparatus comprises: a process chamber configured to process a plurality of substrates accommodated in the process chamber in a stacked manner; a heating unit configured to heat the substrates accommodated in the process chamber; a gas supply unit configured to supply predetermined gas to an inside of the process chamber; an exhaust unit configured to exhaust gas from the inside of the process chamber; and a control unit configured to control at least the gas supply unit, wherein the control unit controls the gas supply unit to form first amorphous silicon films on the substrates by supplying first gas to the inside of the process chamber, and then to form second amorphous silicon films on the substrates by supplying second gas having a lower order than the first gas to the inside of the process chamber.

(Supplementary Note 12)

In the substrate processing apparatus of Supplementary Note 11, the control unit may control the heating unit to perform heat treatment on the first and second amorphous silicon films for allowing solid phase epitaxial growth in a state where exposed monocrystalline silicon surfaces of the substrates act as seeds.

(Supplementary Note 13)

In the substrate processing apparatus of Supplementary Note 11 or 12, the control unit may control the heating unit to heat the substrates to a higher temperature when the second gas is supplied than when the first gas is supplied.

(Supplementary Note 14)

According to another embodiment of the present invention, a substrate processing apparatus comprises: a process chamber configured to process a plurality of substrates accommodated in the process chamber in a stacked manner; a heating unit configured to heat the substrates accommodated in the process chamber; a gas supply unit configured to supply predetermined gas to an inside of the process chamber; an exhaust unit configured to exhaust gas from the inside of the process chamber; and a control unit configured to control at least the gas supply unit, wherein the control unit controls the gas supply unit to form first amorphous silicon films on the substrates by supplying first gas to the inside of the process chamber, and then to form second amorphous silicon films on the substrates by supplying second gas different from the first gas to the inside of the process chamber; and the control unit controls the heating unit, so that when the second gas is supplied, the substrates are heated to a temperature higher than a temperature to which the substrates are heated when the first gas is supplied but lower than a polycrystallization temperature of the second gas.

(Supplementary Note 15)

In the substrate processing apparatus of Supplementary Note 14, the control unit may control the heating unit to perform heat treatment on the first and second amorphous silicon films for allowing solid phase epitaxial growth in a state where exposed monocrystalline silicon surfaces of the substrates act as seeds.

(Supplementary Note 16)

In the substrate processing apparatus of any one of Supplementary Notes 11 to 15, the control unit may control at least one or side of the gas supply unit and the exhaust unit so as to purge the inside of the process chamber after the first gas is supplied but prior to the supply of the second gas.

(Supplementary Note 17)

In the substrate processing apparatus of any one of Supplementary Notes 11 to 16, the control unit may control at least one or side of the gas supply unit and the exhaust unit so as to keep the inside of the process chamber at a lower pressure when the first gas is supplied than when the second gas is supplied.

(Supplementary Note 18)

In the substrate processing apparatus of any one of Supplementary Notes 11 to 17, the control unit may control the heating unit to keep the substrates in a temperature range from about 450° C. to about 550° C. when the first gas is supplied and at a temperature equal to or lower than about 580° C. when the second gas is supplied.

(Supplementary Note 19)

According to another embodiment of the present invention, a substrate processing apparatus comprises: a process chamber configured to process a plurality of substrates accommodated in the process chamber in a stacked manner; a heating unit configured to heat the substrates accommodated in the process chamber; a gas supply unit configured to supply predetermined gas to an inside of the process chamber; an exhaust unit configured to exhaust gas from the inside of the process chamber; and a control unit configured to control at least the gas supply unit, wherein the control unit controls at least the heating unit and the gas supplying unit to form first amorphous silicon films on the substrates by supplying $Si_2H_6$ gas to the inside of the process in a state where the substrates are kept in a temperature range from about 450° C. to about 500° C., and then to form second amorphous silicon films on the substrates by supplying $SiH_4$ gas to the inside of the substrates in a state where the substrates are kept at a temperature equal to or lower than about 580° C., (Supplementary Note 20)

In the substrate processing apparatus of Supplementary Note 19, the control unit may control at least one or side of the gas supply unit and the exhaust unit to purge the inside of the process chamber after the $Si_2H_6$ gas is supplied but prior to the supply of the $SiH_4$ gas.

(Supplementary Note 21)

In the substrate processing apparatus of Supplementary Note 19 or 20, the control unit may control at least one or side of the gas supply unit and the exhaust unit to keep the inside of the process chamber at a lower pressure when the $Si_2H_6$ gas is supplied than when the $SiH_4$ gas is supplied.

(Supplementary Note 22)

In the substrate processing apparatus of any one of Supplementary Notes 11 to 21, only first layers are formed as the first amorphous silicon films.

What is claimed is:

1. A substrate processing method for forming an amorphous silicon film on a monocrystalline substrate having an insulating film formed on at least a surface portion thereof and an exposed silicon surface, the substrate processing method comprising:
   (a) accommodating a plurality of substrates in a process chamber by carrying and stacking the substrates in the process chamber;
   (b) forming first amorphous silicon films to a predetermined thickness by heating at least the substrates and supplying first gas; and
   (c) forming second amorphous silicon films to a predetermined thickness by heating at least the substrates and supplying second gas different from the first gas,
   wherein the first gas is higher order gas than the second gas.

2. The substrate processing method of claim 1, further comprising (d) performing heat treatment on the first and second amorphous silicon films for allowing solid phase epitaxial growth in a state where exposed monocrystalline silicon surfaces of the substrates act as seeds.

3. The substrate processing method of claim 2, wherein the forming (c) is performed at a higher process temperature than the forming (b).

4. The substrate processing method of claim 3, wherein the forming (b) is performed by heating the substrates to a temperature ranging from about 450° C. to about 550° C. and using $Si_2H_6$ as the first gas, and
   the forming (c) is performed by heating the substrates to a temperature higher than the temperature to which the substrates are heated in the forming (b) but equal to or lower than about 580° C. and by using $SiH_4$ as the second gas.

5. The substrate processing method of claim 2, wherein the forming (b) is performed by heating the substrates to a temperature ranging from about 450° C. to about 550° C. and using $Si_2H_6$ as the first gas, and
   the forming (c) is performed by heating the substrates to a temperature higher than the temperature to which the substrates are heated in the forming (b) but equal to or lower than about 580° C. and by using $SiH_4$ as the second gas.

6. The substrate processing method of claim 1, wherein the forming (c) is performed at a higher process temperature than the forming (b).

7. The substrate processing method of claim 6, wherein the forming (b) is performed by heating the substrates to a temperature ranging from about 450° C. to about 550° C. and using $Si_2H_6$ as the first gas, and
   the forming (c) is performed by heating the substrates to a temperature higher than the temperature to which the substrates are heated in the forming (b) but equal to or lower than about 580° C. and by using $SiH_4$ as the second gas.

8. The substrate processing method of claim 1, wherein the forming (b) is performed by heating the substrates to a temperature ranging from about 450° C. to about 550° C. and using $Si_2H_6$ as the first gas, and the forming (c) is performed by heating the substrates to a temperature higher than the temperature to which the substrates are heated in the forming (b) but equal to or lower than about 580° C. and by using $SiH_4$ as the second gas.

* * * * *